(12) United States Patent
Allen et al.

(10) Patent No.: US 6,801,088 B2
(45) Date of Patent: Oct. 5, 2004

(54) DUAL GATE LOW NOISE AMPLIFIER

(75) Inventors: Barry R. Allen, Redondo Beach, CA (US); Yun H. Chung, Redondo Beach, CA (US); David J. Brunone, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/364,999

(22) Filed: Feb. 12, 2003

(65) Prior Publication Data

US 2004/0155710 A1 Aug. 12, 2004

(51) Int. Cl.⁷ .............................. H03F 3/16; H03G 3/20
(52) U.S. Cl. ..................................... 330/277; 330/285
(58) Field of Search .................................. 330/277, 281, 330/282, 285, 294

(56) References Cited

U.S. PATENT DOCUMENTS

| | | | | |
|---|---|---|---|---|
| 4,409,557 A | * | 10/1983 | Sechi | 330/277 |
| 4,806,876 A | * | 2/1989 | Usui et al. | 330/279 |
| 4,849,710 A | * | 7/1989 | Vo | 330/277 |

* cited by examiner

*Primary Examiner*—Steven J. Mottola
(74) *Attorney, Agent, or Firm*—Tarolli, Sundheim, Covell & Tummino L.L.P.

(57) ABSTRACT

A low noise amplifier topology includes a dual gate transistor device, such as a HEMT device and employs resistive feedback with a DC block associated with the amplifier output to a desired high voltage gain and a low noise figure over a desired range of frequencies.

20 Claims, 10 Drawing Sheets

DUAL GATE LOW NOISE AMPLIFIER

TECHNICAL FIELD

The present invention relates generally to signal amplification, and more particularly to a dual gate amplifier having low noise characteristics.

BACKGROUND OF THE INVENTION

A low noise amplifier (LNA) is utilized in various aspects of wireless communications, including wireless LANs, cellular communications, and satellite communications. A LNA is often utilized in an input stage of a signal receiving apparatus or receiver. For example, the LNA amplifies a received RF (Radio Frequency) input signal so that an amplified RF signal has a desired gain and noise figure.

Two main concerns associated with the design of amplifiers utilized for low noise RF amplification include: (1) the minimization of noise added to the signal by the amplifier; and (2) achieving maximum power transfer between a source producing the electrical signal and the amplifier. A figure of merit for noise added by the amplifier is the ratio of the signal-to-noise ratio at the input to the signal-to-noise ratio at the output of the amplifier. This ratio is commonly referred to as the Noise Factor (F) of the amplifier, and is used to calculate the Noise Figure (NF) of the amplifier according to the formula NF=10 $\log_{10}$ (F), where F=(S/N)$_{IN}$/(S/N)$_{OUT}$. A measurement from a noise figure meter also can be employed to ascertain noise associated with operation of the amplifier.

In bipolar technology, a popular low noise amplifier topology is the Darlington feedback amplifier. The Darlington feedback amplifier includes a Darlington-connected pair of bipolar transistors, which tend to provide increased input impedance relative to a single bipolar transistor. The conventional Darlington feedback amplifier typically employs resistive feedback and is operative to achieve broad frequency bandwidths. As a result, such an amplifier can achieve reasonably good input and output matching. Broadband amplifiers of this type tend to employ feedback paths that introduce additional unwanted noise into the amplifier output. The conventional wide bandwidth amplifiers, such as the Darlington-connected feedback type are generally achieved at the expense of realizing higher amounts of noise. While the Darlington pair resistive feedback amplifier is traditionally used for medium to high gain applications, the current gain and base resistance of the active device tend to limit the noise figure. These and other conventional amplifier approaches usually fail to optimize source impedance matching for microwave devices, which also can result in added noise.

Designing LNA's is a trade-off between noise figure, bandwidth, VSWR, gain and stability of the amplifier. As a result, a compromise often must be reached between the end goals, which can be conflicting at times.

BRIEF SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a low noise amplifier that includes a dual gate transistor, such as a dual gate field effect transistor (FET) or high electron mobility transistor (HEMT) device. The amplifier includes a feedback network having a resistive component and a DC blocking component, such as a capacitor, coupled between an input and output of the amplifier.

According to one aspect of the present invention, the DC blocking component is located at an output side of the feedback network. The resistive component can be connected at an input side of the feedback network in series with the DC blocking component.

In order to operate an amplifier configured in accordance with an aspect of the present invention, a first bias network can be provided to feed a first bias voltage to a node of the feedback network for biasing a first gate of the dual gate transistor device, which is coupled to the amplifier input. A second bias network is coupled to bias another gate of the dual gate transistor device. The RF input is provided to the first gate and is amplified by the amplifier.

Such an arrangement enables improved performance, including low noise figure and a high gain, compared to conventional amplifiers designed to achieve similar gain. Additionally, an amplifier can be implemented according to an aspect of the present invention as a single stage amplifier on a single chip, occupying less real estate relative to conventional amplifier designs.

Another aspect of the present invention provides a method for implementing a low noise amplifier. The method includes providing a dual gate transistor device connected between an input and an output of the amplifier. Resistive feedback is provided between the output and a first gate of the transistor device and electrically connected with the input of the amplifier to provide the amplifier with a desired gain. The feedback also includes a DC blocking component in series with a resistive part of the resistive feedback. To operate the amplifier, the first gate of the transistor device is biased with a first DC voltage, such as through a node associated with the resistive feedback. A second gate of the transistor device is biased with a second DC voltage that is greater than the first voltage. As a result, a low noise figure (e.g., less than about 1 dB) can be achieved for the amplifier over a desired frequency range.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to a low noise amplifier topology that can be implemented with a dual gate high electron mobility transistor (HEMT) device. The amplifier employs resistive feedback with a DC block associated with the amplifier output to provide desired high voltage gain and a low noise figure for desired frequencies, such as generally in the range of VHF and microwave frequencies.

Figure 1:
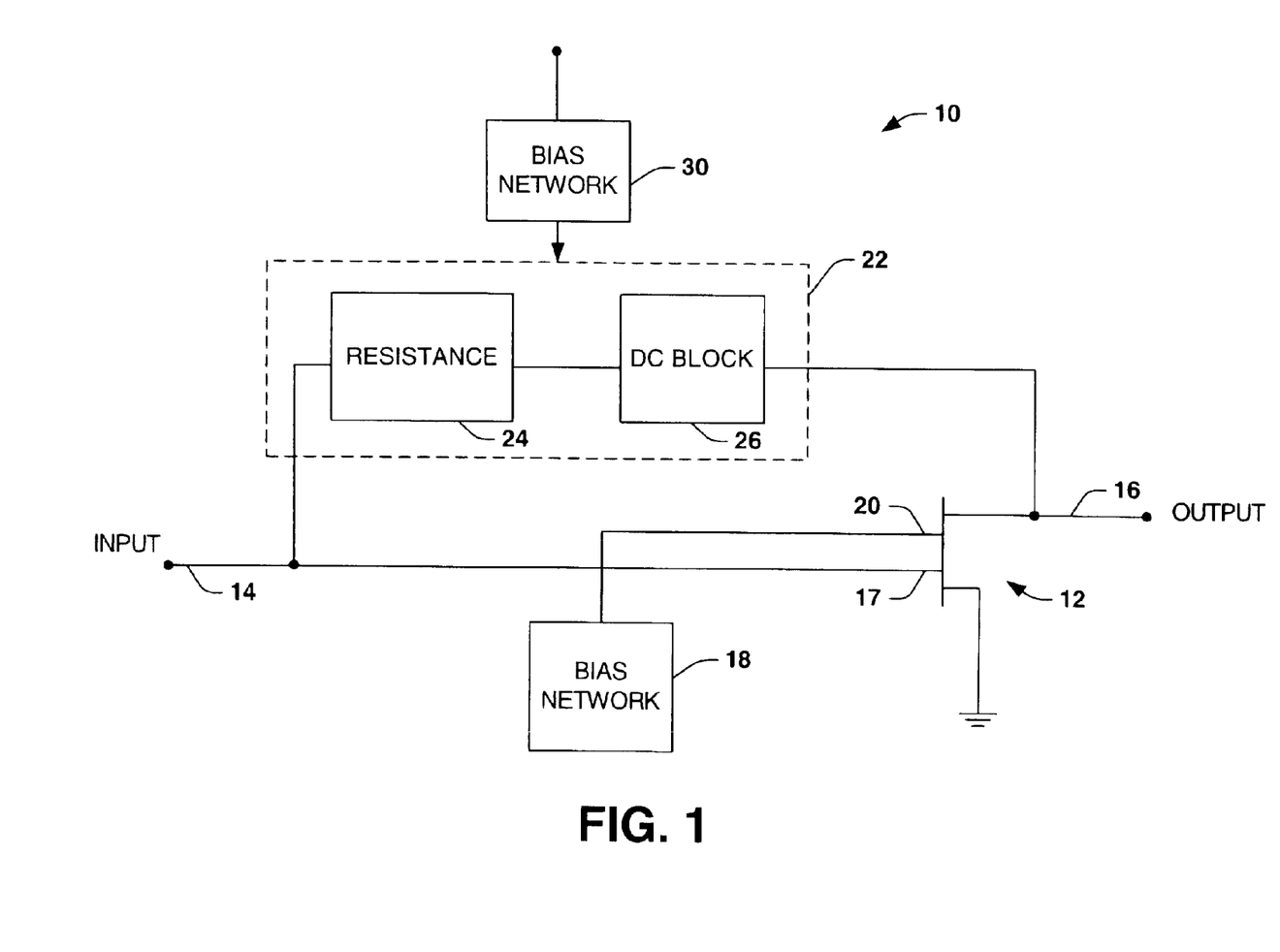
FIG. 1 illustrates an example of a low noise amplifier in accordance with an aspect of the present invention.

FIG. 1 illustrates a schematic example of a low noise amplifier 10 in accordance with an aspect of the present invention. The amplifier 10 includes a dual gate transistor device 12 that is coupled to an input 14 for receiving a RF input signal. The transistor device 12 is operative to amplify the RF input signal and provide an amplified output signal at an associated output 16.

The transistor device 12 can be a dual gate field effect transistor (FET) fabricated to provide high electron mobility (e.g., a high electron mobility transistor (HEMT) device). A dual gate HEMT device affords increased output resistance and high transconductance. As a result, operation of the amplifier can more closely approximate ideal operation. The input 14 is electrically coupled to a first gate 17 of the transistor device 12 for providing the RF input signal. A bias network 18 is coupled to bias a second gate 20 of the transistor device 12, such as at a positive voltage. For example, the bias network 18 is configured to provide a desired DC bias at the gate 20, such as a positive DC voltage.

In accordance with an aspect of the present invention, the amplifier 10 includes a feedback network 22. The feedback network 22 includes a resistance component 24 and a DC blocking component 26. The resistance component 24 enables the dual gate transistor device 12 to provide very high gain (e.g., greater than 15 dB) with good input and output matching characteristics. Because the gain is high, the noise contribution of the resistance component 24 can be made low. Additionally, the use of the resistance component 24 in conjunction with the dual gate transistor device 12 and, more particularly with a dual gate HEMT device, provides increased output resistance, improved input/output isolation and low intrinsic noise.

The DC blocking component 26 is connected toward the output 16 of the amplifier 10. In the example of FIG. 1, the DC blocking component 26 is connected between the drain 16 of the transistor device 12 and the resistance component 24. The DC blocking component 26 can be a capacitor or a combination of one or more other devices operative to provide a desired RF connection from the feedback network 22 to the output at 16.

Another bias network 30 is coupled to provide a DC gate bias to the feedback network 22. The bias can be coupled to provide the gate bias at a juncture between the resistance component 24 and the DC blocking component 26. Alternatively, the bias network 30 can be coupled to provide the gate bias to a junction of the resistance component 24 and the input 14 to provide a desired DC bias.

By way of example, the bias network 30 can include a resistor (e.g., having a desired resistance) or it can be configured as a RF choke network (e.g., having an inductance). The bias network 30 is operative to provide a small negative DC voltage to the feedback network 22. By configuring the bias network 30 appropriately, the bias network will cooperate with the DC blocking component 26, such that noise associated with the bias network is applied at the output and thus contributes very little to the noise figure.

In view of the foregoing, those skilled in the art will understand and appreciate various ways to implement an amplifier 10 in accordance with an aspect of the present invention. Such an approach provides a single stage amplifier having a higher gain and lower noise figure than conventional amplifiers with similar gain, such as a Darlington pair amplifier. Some examples of possible amplifier circuits that can be implemented according to an aspect of the present invention are described with respect to the following FIGS. 2–4.

Figure 2:
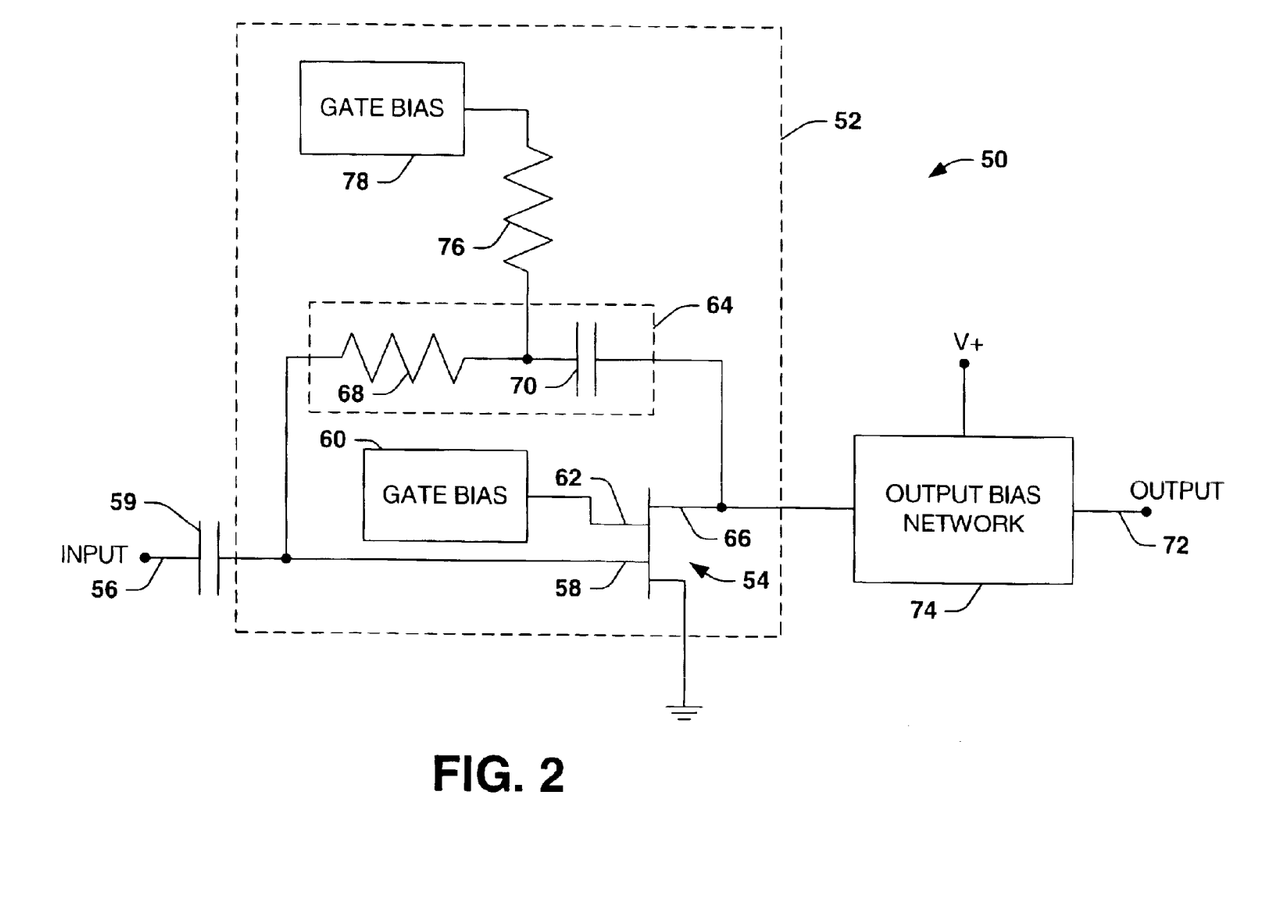
FIG. 2 illustrates an example of a low noise amplifier in accordance with another aspect of the present invention.

FIG. 2 depicts an example of an amplifier system 50 that includes a low noise amplifier 52 in accordance with an aspect of the present invention. The amplifier 52, which can be implemented as an integrated circuit (IC) chip, includes a dual gate transistor device 54 that provides a single stage of the amplifier. The dual gate transistor device 54 can be a dual gate FET or HEMT device configured to have a high transconductance. For example, the HEMT device can be formed of GaAs, InP, GaN as well as other types of HEMT structures capable of increased electron mobility. The dual gate transistor device 54 enables increased gain for each stage. Thus, a single stage amplifier can be configured in accordance with an aspect of the present invention, having improved noise figure and a high degree of linearity.

An input 56 is capacitively coupled to a gate 58 of the device 54, such as through a capacitor 59. The capacitor, which is depicted as external to the amplifier 52, provides a DC blocking function at the input of the amplifier system 50, allowing input RF signal to be amplified by the amplifier 52 in accordance with an aspect of the present invention.

A gate bias network 60 is coupled to bias another gate 62 of the device 54. The amount of bias provided to the gate 62 generally depends on the application and power requirements of the amplifier system 50. For example, the bias network 60 can provide a positive DC voltage, such as in a range from about 0.5V to about 3.0V. Those skilled in the art will understand and appreciate that different voltages may be appropriate in some applications.

The amplifier 52 also includes a feedback network 64 connected between a drain 66 and the gate 58 of the dual gate transistor device 54. In the example of FIG. 2, the drain 66 corresponds to the output of the amplifier 52. The feedback network 64 includes a resistor 68 coupled in series with a capacitor 70. The value of the feedback resistor 68 can be selected according to a desired noise figure, gain as well as based on the transconductance of the dual gate transistor device 54. By way of example, the feedback resistance can range from about 500Ω to about 2000Ω for applications in the VHF through microwave frequency range.

As mentioned above, the resistor 68 enables the dual gate transistor device 54 to provide very high gain with good input and output matching characteristics and desired linearity. Because the gain is high, the noise contribution of the resistor 68 can be made low. Additionally, the use of the resistor 68 in conjunction with a dual gate HEMT device 54 facilitates increased output resistance and improved input/output isolation and low intrinsic noise.

The capacitor 70 is connected between the resistor 68 and the drain 66, which affords desired DC blocking functionality to provide a RF connection to an output 72 of the amplifier system 50. The value of the capacitor 70 can vary according to the application of the amplifier system 50. By way of example, for low frequency applications ranging from the high VHF range (e.g., about 10 MHz) to the low microwave range (e.g., about 10 GHz), the capacitance can range from about 200 pF to about 1000 pF. Those skilled in the art will understand and appreciate that different capacitances can be utilized, according to an aspect of the present invention, depending at least in part on the application for which the amplifier 52 is being utilized.

The output 72 of the amplifier system 50 is coupled to the drain 66 through an output bias network 74. The output bias network 74 is configured to provide added stability at the amplifier output 72. The configuration of the output bias network 74 is generally application specific and thus typically is implemented external to the IC containing the amplifier 52. In general, a DC voltage V+ is applied at an input of the output bias network 74. Those skilled in the art will understand and appreciate various types and configurations of output bias networks that can be utilized in conjunction with an amplifier 52 in accordance with an aspect of the present invention.

The amplifier 52 also includes a biasing resistor 76 coupled to a juncture of the resistor 68 and the capacitor 70. A gate bias network 78 provides a DC voltage to the resistor 76, which is operative to bias the gate 58. By providing the gate bias to the juncture of the resistor 68 and the capacitor 70 with the capacitor being connected toward the drain 66, noise associated with the bias resistor 76 is applied to the drain 66. As a result, the biasing resistor 76 contributes very little to the overall noise figure of the amplifier 52. The biasing resistor 76 also affords a desired high bandwidth for the amplifier 52 and operates to bias the gate 58 through the resistors 76 and 68, respectively.

The DC bias provided to the biasing resistor 76 typically is low negative DC voltage, such as less than 0V (e.g., about −1V). Those skilled in the art will understand and appreciate that other voltages can be selected according to desired operating requirements of the amplifier 52. The gate bias network 78 and biasing resistor 76 can be implemented as part of the amplifier IC, as depicted in FIG. 2. This can afford efficiencies as well as improve performance of the amplifier 52.

Figure 3:
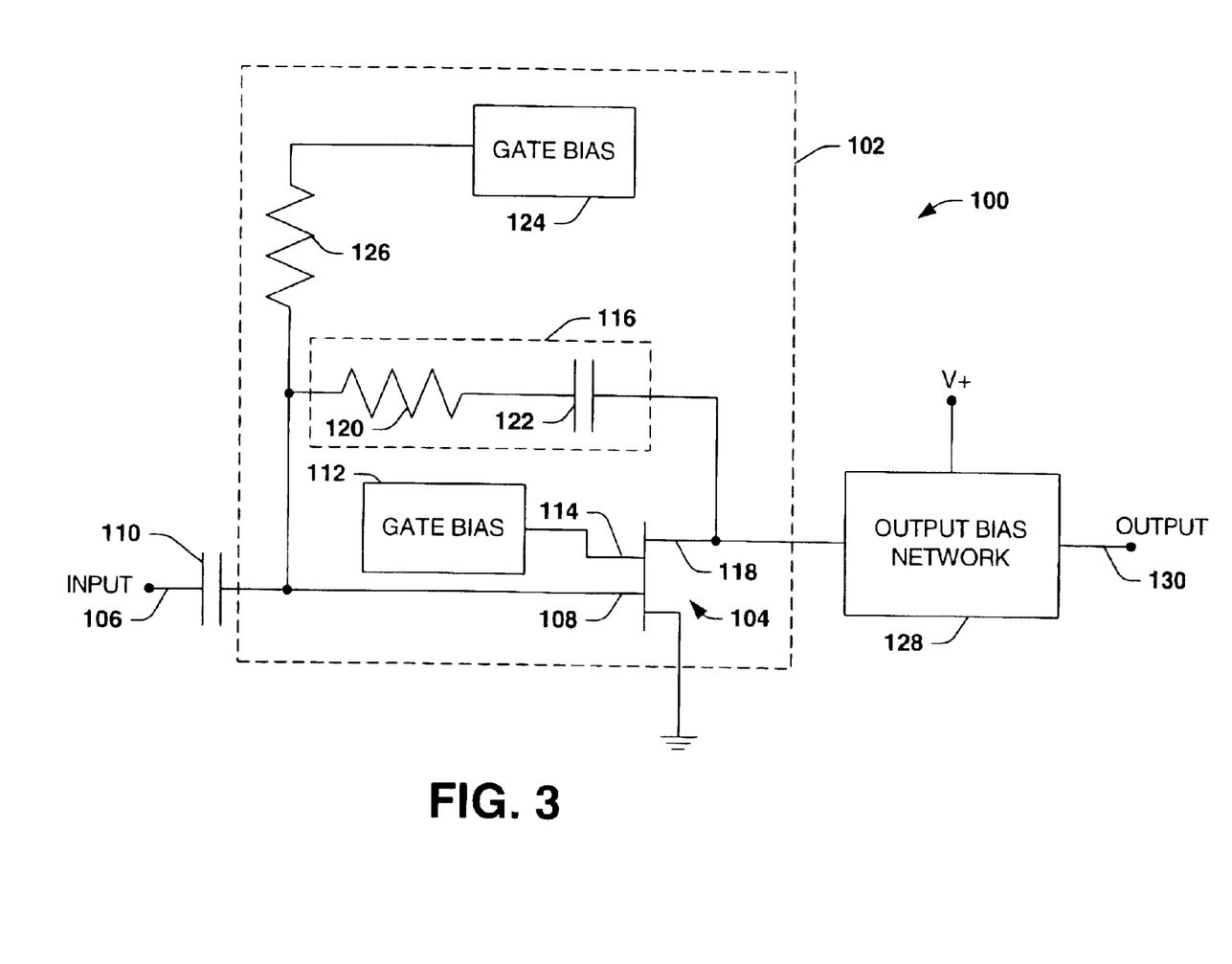
FIG. 3 illustrates an example of a low noise amplifier in accordance with yet another aspect of the present invention.

FIG. 3 is an example of another amplifier system 100 that includes a low noise amplifier 102 in accordance with an aspect of the present invention. The amplifier 102 is similar to the amplifier shown and described with respect to FIG. 2. Briefly stated, the amplifier 102 includes a dual gate transistor device 104, such as a dual gate FET or HEMT. For example, the HEMT device is fabricated to provide increased electron mobility device as well as to have a high transconductance. The dual gate transistor device 104 thus can be utilized to provide a single stage amplifier 102 that exhibits high gain with an improved noise figure and a high degree of linearity when compared to conventional amplifiers having similar gain.

A RF input signal provided at an input 106 is passed to a gate 108 of the HEMT device 104 through a DC blocking capacitor 110. A gate bias network 112 is coupled to provide a desired bias at another gate 114 of the device 104. As mentioned above, the bias network 112 is configured to bias the gate 114, for example, with a positive DC voltage, which can be set depending generally on the application and power requirements of the amplifier system 100.

The amplifier 102 also includes a feedback network 116 connected between a drain 118 and the gate 108 of the HEMT device 104 in accordance with an aspect of the present invention. In particular, the feedback network 116 includes a resistor 120 coupled in series with a capacitor 122, such as described with respect to FIG. 2. The resistor 120 can be selected to provide a desired gain according to a desired noise figure and the transconductance of the dual gate transistor device 104 (e.g., in a range from about 500Ω to about 2000Ω). Because resistive feedback can be configured to provide a high gain (e.g., greater than about 15 dB, such as in the range of 20–30 dB or greater), noise contributed by the feedback resistor 120, which is applied to the output through the DC blocking capacitor 122, can be made low. As with the resistance of the feedback resistor 120, the value of the capacitor 122 can vary according to the application of the amplifier system 100, for example, ranging from about 200 pF to about 1000 pF for low frequency applications (e.g., in the range of about 10 MHz to about 10 GHz).

A gate bias network 124 provides a desired DC bias to the gate 108 through a biasing resistor 126, both of which can be implemented as part of the amplifier IC, as depicted in FIG. 3. The biasing resistor 126 is coupled to a juncture between the feedback resistor 120 and the gate 108. While connecting the biasing resistor 126 at such location may result in more noise than the configuration of FIG. 2, low frequency stability of the amplifier 102 is improved. Accordingly, those skilled in the art will understand and appreciate that different biasing configurations, according to an aspect of the present invention, may prove beneficial for different applications. By way of example, the gate bias network 124 provides a low negative DC voltage, such as less than 0V (e.g., about −1V DC), to the biasing resistor 126. Those skilled in the art will understand and appreciate that other voltages can be selected according to desired operating requirements of the amplifier 102.

An output bias network 128 is coupled to the drain 118 for providing a desired amplified output signal at an associated output 130 of the amplifier system 100. The configuration of the output bias network 128 will be generally application specific and thus typically is implemented external to the IC containing the amplifier 102, as depicted in FIG. 3.

Figure 4:
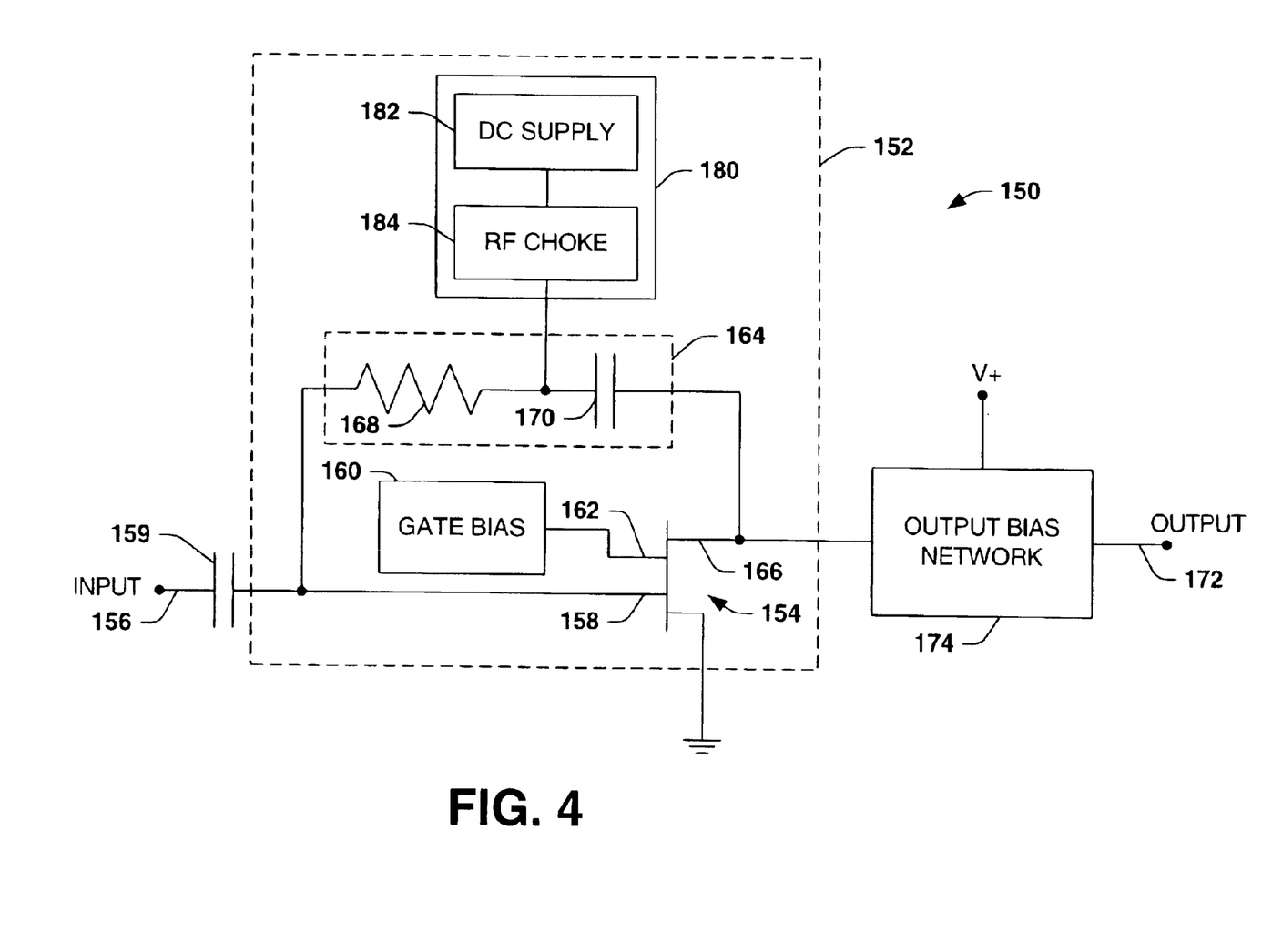
FIG. 4 illustrates an example of a low noise amplifier in accordance with still another aspect of the present invention.

FIG. 4 depicts another example of an amplifier system 150 that includes a low noise amplifier 152 in accordance with an aspect of the present invention. The amplifier 152 is substantially similar to the configuration shown and described with respect to FIG. 2; however, a different type of bias network 180 is utilized from that of FIG. 2. Because the amplifier system 150 is similar to that shown in FIG. 2, except for the bias network 180, identical reference numbers increased by adding 100 refer to corresponding parts previously identified in FIG. 2. Accordingly, reference should be made to the description of FIG. 2 for additional information about corresponding parts shown in FIG. 4.

In the example of FIG. 4, the gate bias network 180 is coupled to a juncture between the feedback resistor 168 and the DC blocking capacitor 170 for biasing the gate 158 of the dual gate device 154 through the feedback resistor. The bias network 180 includes a DC supply 182 that provides a desired DC bias to a RF choke network 184, which affords desired RF performance and stability in the amplifier 152. The RF choke 184 and DC supply 182 can be implemented as part of the same IC chip as the amplifier 152, for example.

By way of example, the RF choke bias 184 can employ a commercially available coil or inductor, although other IC configurations also could be utilized to provide a RF choke having a desired bandwidth. The RF choke network 184 can be utilized alone or in series with a resistor (not shown) for biasing the gate 158. Additionally, while the RF choke is depicted as coupled to the feedback network 164 at the juncture between the feedback resistor 168 and the DC blocking capacitor 170, those skilled in the art will understand and appreciate that it alternatively could be coupled to the gate 158 more directly, such as at the end of the feedback resistor toward the input 156.

In view of the above examples of amplifiers and amplifier systems that can be implemented in accordance with an aspect of the present invention, those skilled in the art will understand and appreciate that a single stage amplifier according to an aspect of the present invention can achieve a higher gain than many conventional amplifiers. An enhanced multi-stage amplifier that include two or more cascaded amplifiers, such as described herein, can be use to achieve even higher gain according to an aspect of the present invention. Additionally, those skilled in the art will appreciated that an amplifier according to an aspect of the present invention tends to have a lower noise figure than conventional amplifier configurations having similar gain, such as the Darlington pair amplifier.

By way of example, the amplification approach described herein enables a low noise amplifier with a high gain (e.g., greater than about 15 dB) to achieve a low noise figure (e.g., less than about 1 dB) over a desired frequency range (e.g., 0.5–10 GHz). The amplifier further can provide output power of greater than 20 dBm for a DC power of 5 V at about 50 mA with a third order intercept point (IP3) greater than 10 dBm and even greater than about 30 dBm. Additional benefits associated with implementing an amplifier in accordance with an aspect of the present invention will be better appreciated with reference to FIGS. 5–8.

Figure 5:
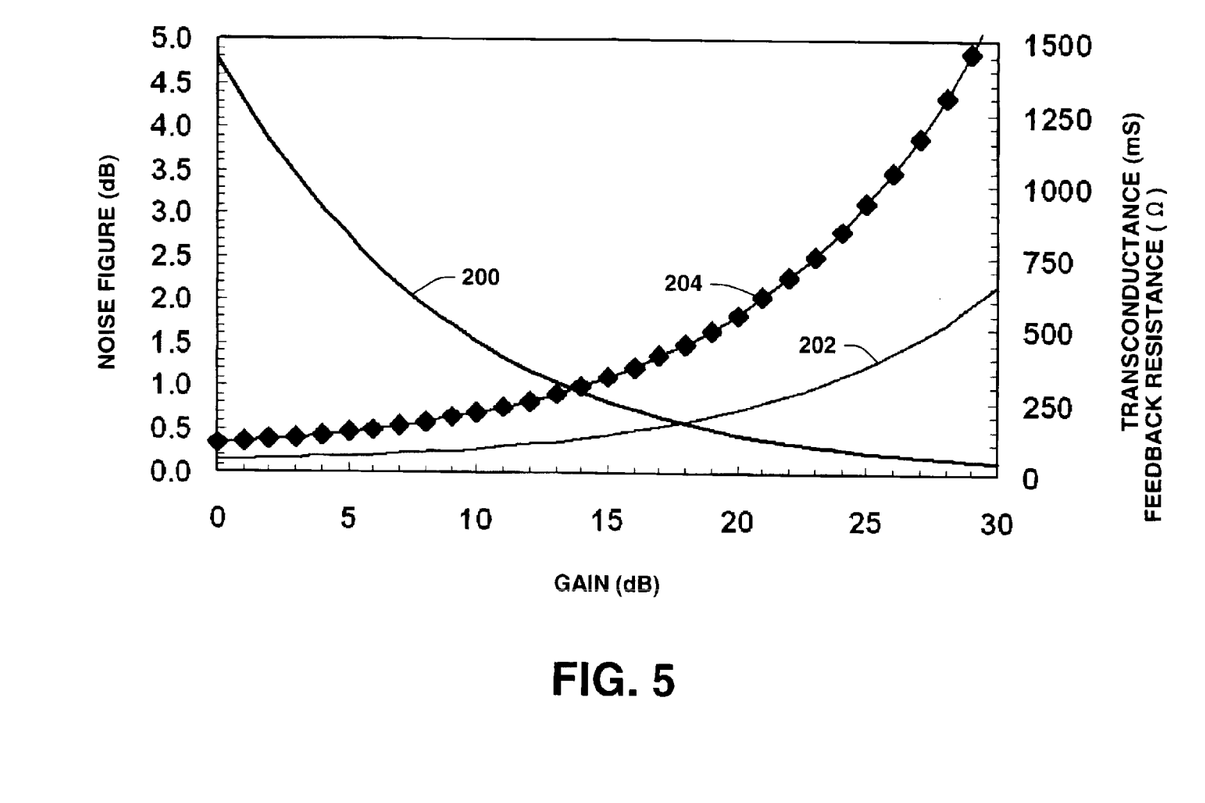
FIG. 5 is a graph of gain, transconductance, resistive feedback and noise figure plotted as function of gain for an amplifier in accordance with another aspect of the present invention.

FIG. 5 is a graph representing the relationship between noise figure, transconductance and feedback resistance, all as a function of gain for an amplifier in accordance with an aspect of the present invention. In particular, the graph includes a plot of the noise figure (dB) indicated at 200, a plot of the transconductance (mS) indicated at 202 and a plot of feedback resistance (Ω) indicated at 204, all plotted as a function of amplifier gain (dB) appearing on the X-axis. In this example, the plotted parameters 200, 202 and 204 correspond to an amplifier having substantially ideal transconductance matched to about 50 Ω). As shown in the example of FIG. 5, a substantially ideal noise figure below 1 dB requires a gain of about 14 dB or more. Thus, from FIG. 5, those skilled in the art will further appreciate that a gain of approximately 20–28 dB is achieved for a feedback resistance in a range from about 500 Ω to about 1300 Ω. Even assuming additional noise (e.g., about 0.5 dB to about 0.7 dB) from operation of a dual gate FET (or HEMT) device in the amplifier, this range of feedback resistance advantageously affords a low noise FIG. 200 (e.g., less than about 1 dB) for gains greater than about 20 dB.

Figure 6:
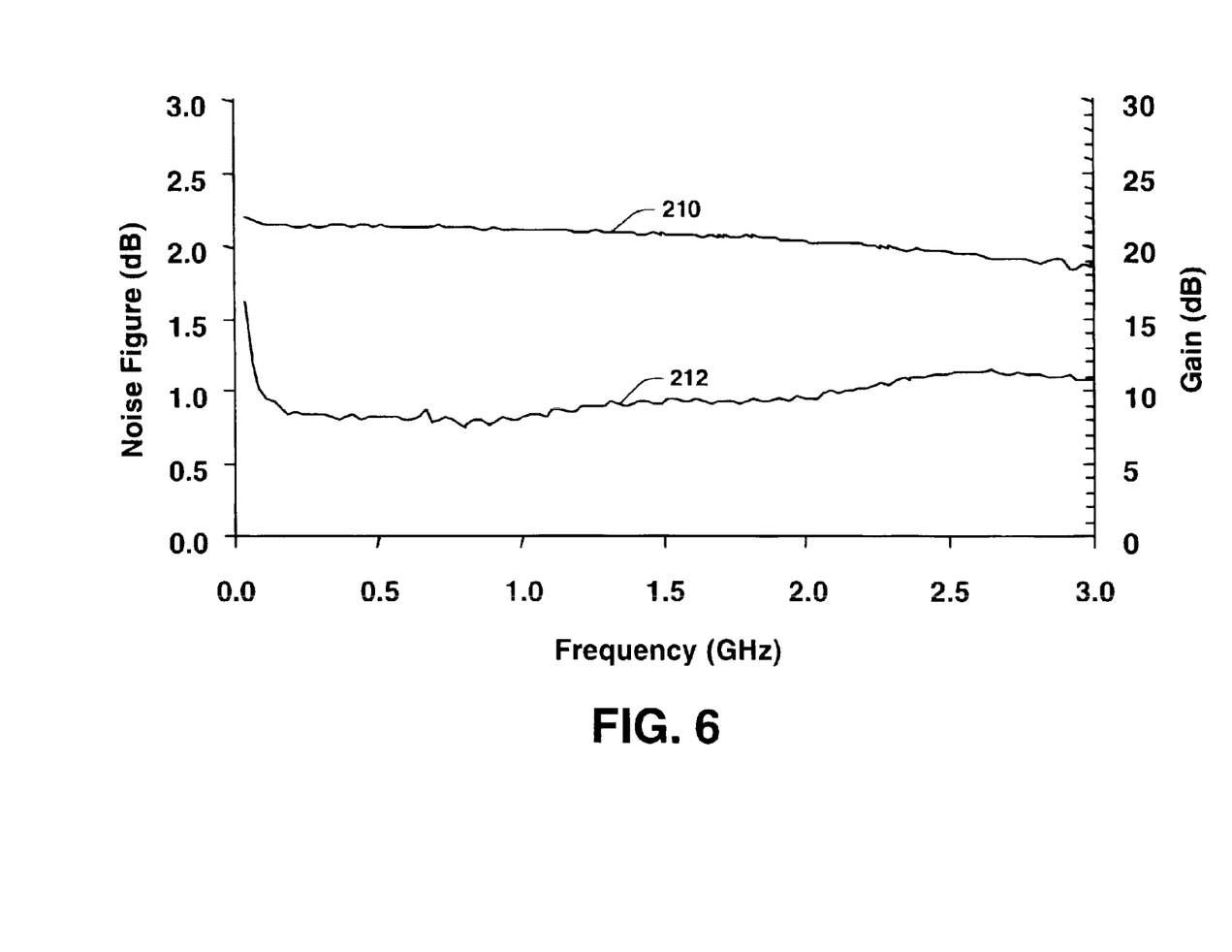
FIG. 6 is a graph of noise figure and gain plotted as function of frequency for an amplifier in accordance with another aspect of the present invention.

FIG. 6 depicts graphs 210 and 212 of gain and noise figure, respectively, plotted as a function of input signal frequency for an amplifier in accordance with an aspect of the present invention. In this example, the amplifier is particularly configured with a DC blocking capacitor in the resistive feedback path (e.g., about 470 pF in series with about 700 Ω resistor) to provide desired gain and low noise figure over a frequency range from about 0.04 GHz to about 3.0 GHz. Those skilled in the art will appreciate that advantages of an amplifier implemented according to an aspect of the present invention can also be obtained for other frequency ranges. The noise FIG. 212 can be measured by a noise figure meter or otherwise computed in a manner known in the art. As described above with respect to FIG. 5, the gain varies as a function of the feedback resistance, which in this example has been set to provide a gain of about 19 dB to about 22.0 dB over the represented frequency range.

Figure 7:
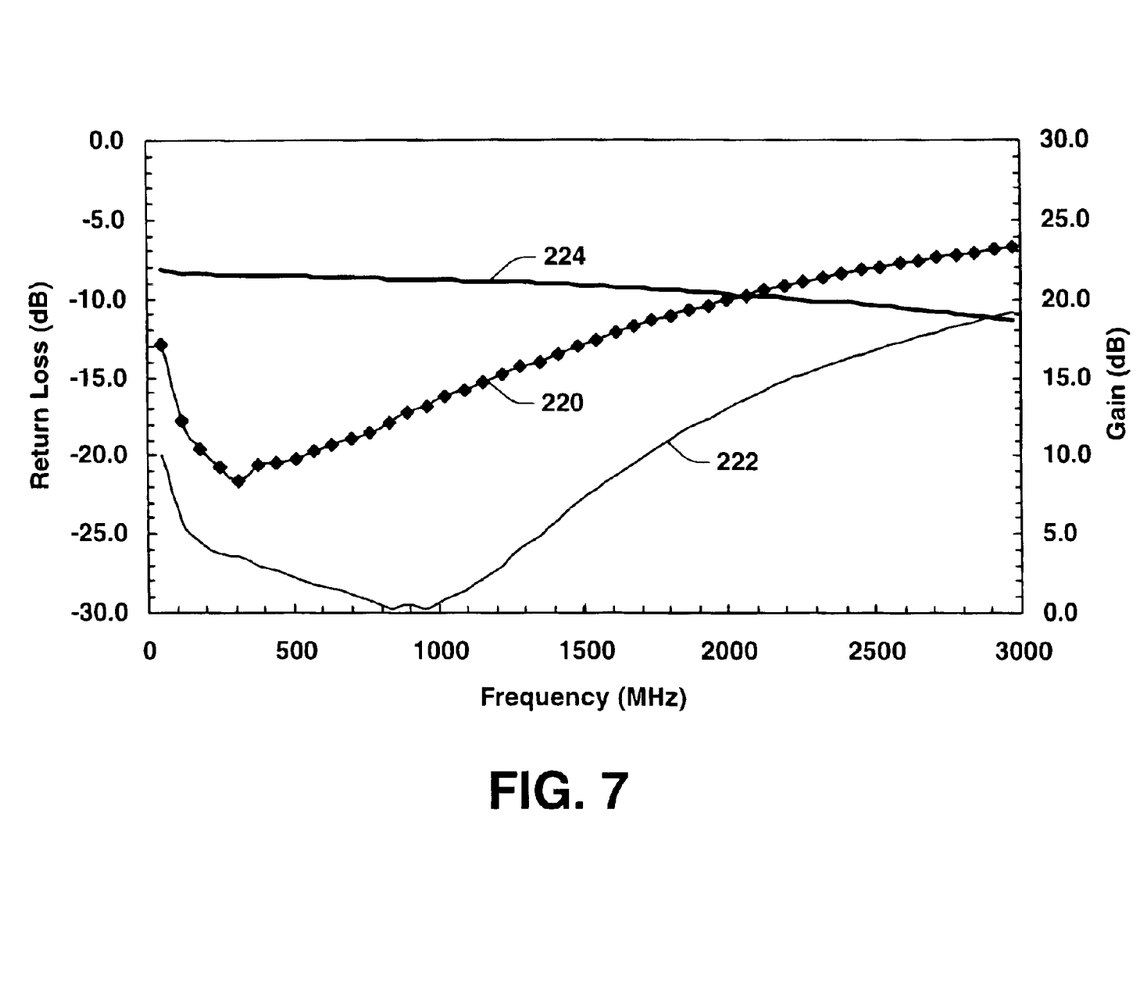
FIG. 7 is a graph of return loss and gain plotted as function of frequency for an amplifier in accordance with another aspect of the present invention.

FIG. 7 illustrates input return loss 220, output return loss 222 and gain 224, all plotted as a function of frequency for an amplifier implemented in accordance with an aspect of the present invention. In the example of FIG. 7, the gain 224 has been set to about 19 dB to about 22 dB over the illustrated frequency range, such as by configuring resistive feedback of the amplifier, as described herein. As depicted, the amplifier performs particularly well, exhibiting lower return loss, over its low frequency range. Those skilled in the art will understand and appreciate that additional matching networks at the input and/or output of the amplifier can be utilized to further help minimize the return loss at higher frequencies. From FIG. 7, it further will be appreciated that even as the input and output return loss increase with an increase in frequency the amplifier gain remains generally constant over the frequency range. Additionally, each of the input and output return loss remains low at higher frequencies relative to conventional amplifier designs.

Figure 8:
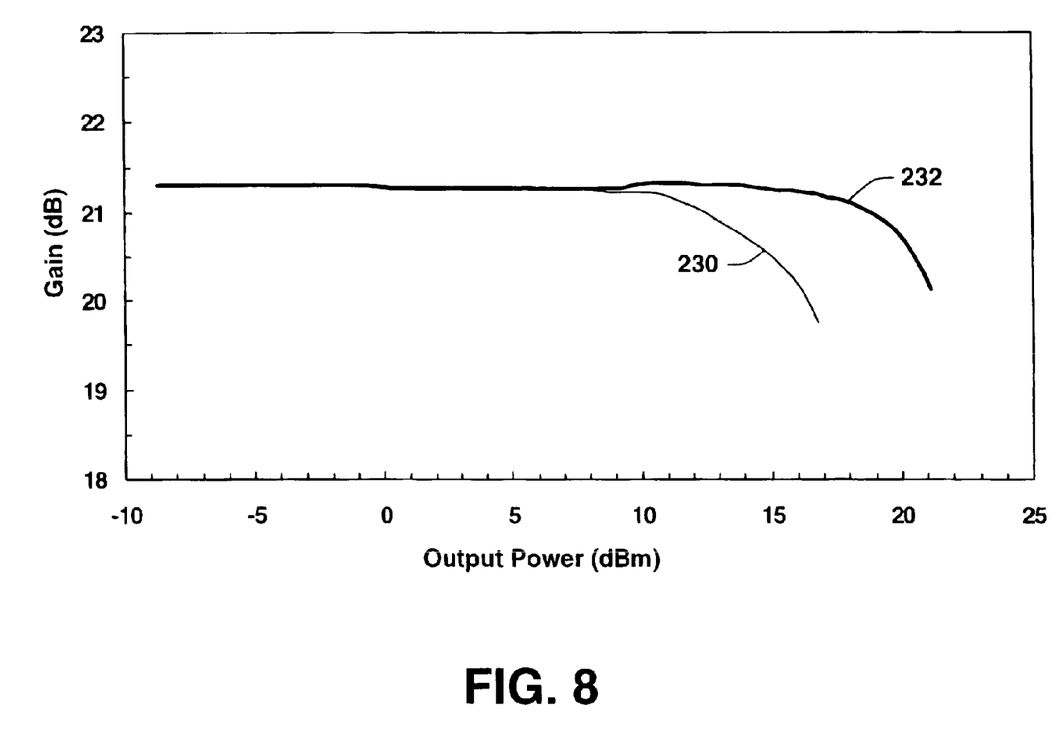
FIG. 8 is a graph of gain plotted as function of output power to demonstrate gain compression for an amplifier in accordance with another aspect of the present invention.

FIG. 8 is a graph depicting measured gain compression, in which gain (dB) is plotted as a function of output power (dBm) for two different amplifier voltages, namely 3V and 5V, indicated at 230 and 232, respectively. In the illustrated example, a drain bias current of about 50 mA and a gate bias voltage of about 1.0V have been applied to the amplifier. As shown in FIG. 8, for the 3V configuration indicated at 230, the amplifier exhibits a gain compression point that occurs at an output power of about 15 dBm. For the 5V case indicated at 232, the gain compression point occurs at an output power of about 20 dBm.

Figure 9:
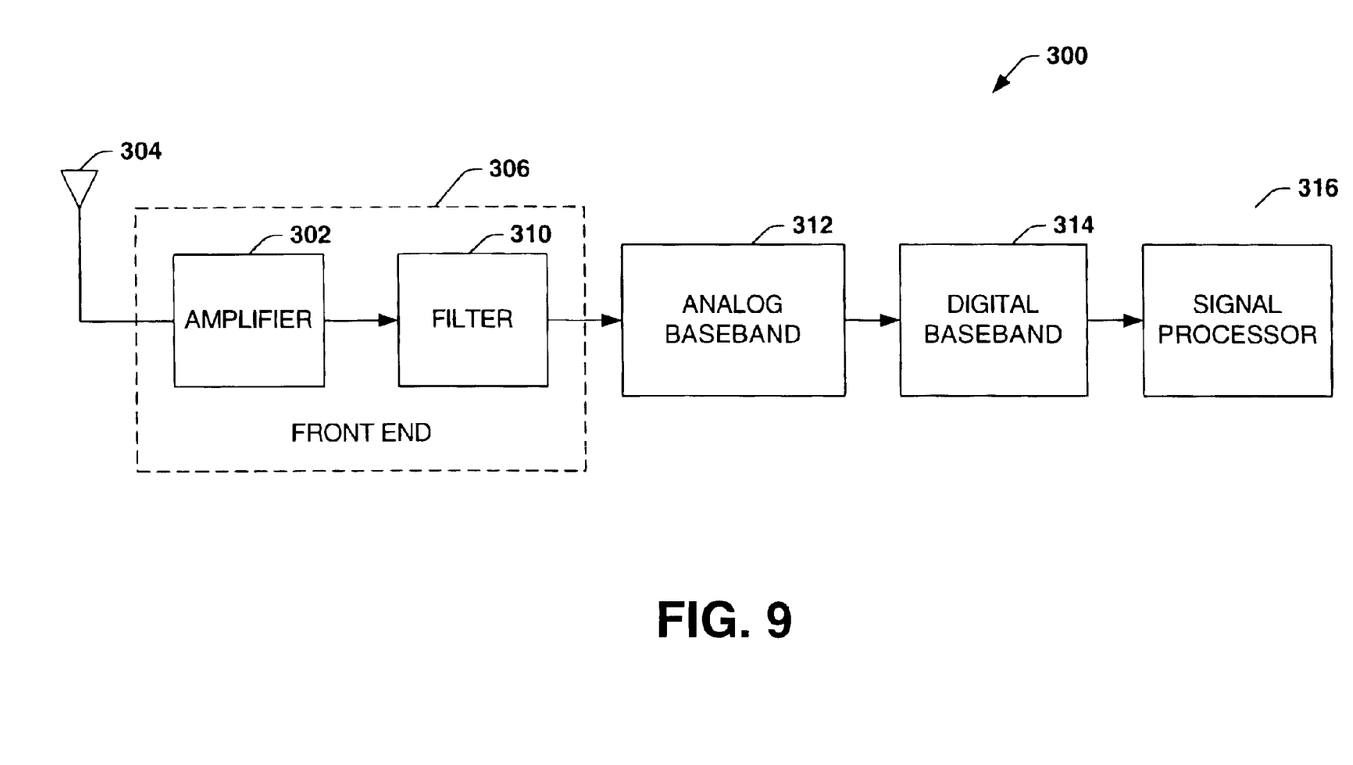
FIG. 9 is an example of a radio system that can implement an amplifier in accordance with another aspect of the present invention.

FIG. 9 illustrates an example of a radio system 300 employing a low noise amplifier 302 in accordance with an aspect of the present invention. For example, the radio system can be part of a wireless communications base station or satellite configured to transmit and/or receive RF signals, such as in the VHF to microwave frequency range (e.g., from about 10 MHz to about 10 GHz). The radio system 300 includes an antenna 304 coupled to a radio front end component 306. The antenna 304 receives a RF or microwave input signal, which captures the RF input signal and transmits the RF input signal to the radio front end component 306.

The radio front end component 306 includes the amplifier 302 configured to amplify the RF input signal to a desired level in accordance with an aspect of the present invention. For example, the amplifier 302 can be configured in a manner as shown and described with respect to FIGS. 1–4, including a dual gate transistor or HEMT device having resistive feedback. As mentioned above, the gain of the amplifier 302 varies as a function of the resistive feedback utilized with the amplifier. The amplifier 302 also employs a DC blocking component, such as a capacitor, in the feedback path to provide a RF connection with the amplifier output and help eliminate unwanted DC signals from interfering with the amplifier output signal.

The front end 306 can also include one or more filters 310 to help remove noise from the RF input signal, which can be located at the input-side or output-side of the amplifier, for example. It is to be appreciated that many variations in radio front end processing exist and that an amplifier 302 configured in accordance with an aspect of the present invention can be utilized in any such configuration thereof. Additionally, those skilled in the art will understand and appreciate that an amplifier according to an aspect of the present in invention can be utilized in other parts of the radio system 300, such as in different parts of a receiver as well as in transmitting portions (not shown).

The front end 306 provides the amplified and filtered RF input signal to a RF port of an analog baseband section or other intermediate circuitry 312. The analog baseband section 312, for example, includes a mixer operative to mix the RF input signal and one or more local oscillator (LO) input signals, such as provided by a local oscillator (not shown). The analog baseband section 312 further can include one or more amplifiers, such as configured in accordance with an aspect of the present invention, as well as filters for further intermediate signal processing. The analog baseband section 312 can provide an intermediate analog output signal (e.g., an IF signal) to an associated digital baseband section 314 of the receiver 300.

The digital baseband section 314 is programmed and/or configured to process the IF signal from the analog baseband section 312. Such processing can include analog/digital conversion as well as additional filtering. It is to be appreciated that such filtering can be implemented in the analog baseband section 312 (prior to conversion) or in the digital baseband section 314 (post conversion). The digital baseband section 314 also can perform appropriate demodulation of the signal. The digital baseband section 314 can provide the processed digital signal to a signal processor 316 for final processing (e.g., decoding, data extraction, and the like). Those skilled in the art will understand and appreciate other configurations of radio systems (or portions thereof) that can utilize a low noise amplifier implemented in accordance with an aspect of the present invention to amplify a RF signal with a low noise figure.

Figure 10:
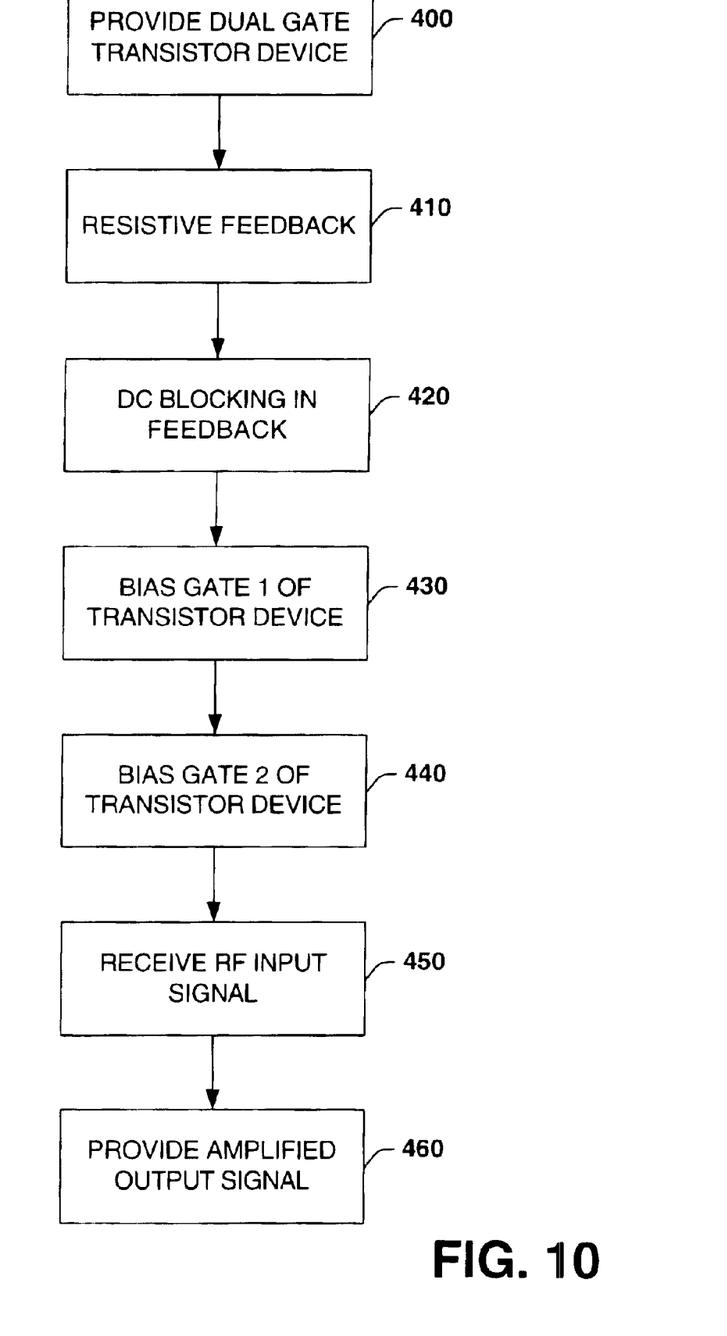
FIG. 10 is a flow diagram illustrating a methodology for implementing low noise amplification in accordance with an aspect of the present invention.

In view of the examples shown and described above, a methodology for low noise amplification in accordance with the present invention will be better appreciated with reference to the flow diagrams of FIG. 10. While, for purposes of simplicity of explanation, the methodology is shown and described as a executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention.

FIG. 10 illustrates a methodology for implementing a low noise amplifier in accordance with an aspect of the present invention. The methodology begins at 400 in connection with providing a dual gate transistor device, such as a HEMT device. At 410, resistive feedback is provided, which can be connected between the drain and a first gate of the transistor device. At 420, DC blocking also is implemented to provide a RF connection from the feedback to the amplifier output. For example, the DC blocking 420 can be implemented by connecting a capacitor in the feedback electrically connected between the resistive part of the feedback and the drain of the transistor device.

At 430, a second gate of the transistor device is biased with a suitable bias voltage (e.g., greater than 0V DC), which can be provided by a biasing network. At 440, the first gate of the transistor device also is biased with a suitable bias voltage (e.g., less than 0V DC). For example, the biasing provided in each of 430 and 440 is a low DC voltage, such as about 1V and −1V DC, respectively, depending on application requirements. The biasing at 440 further can be provided to the feedback network, such as coupled at either end of the resistive part of feedback.

At 450, a RF input signal is received at the input of the amplifier, which is coupled (directly or indirectly) to the first gate of the transistor device. An amplified output signal, in turn, is provided at 460 as a function of the amplifier gain corresponding the RF input signal received at 450.

Those skilled in the art will understand that improved performance for a single stage amplifier implemented according to the foregoing methodology can be implemented to provide improved performance relative to conventional amplifiers having similar gain. For example, for RF input signals greater than 50 MHz, such an approach can achieve a noise figure less than about 1 dB and output power of about 20 dBm or greater at 1 dB compression. Such an arrangement also can provide an amplifier having a third order intercept point (IP3) at the output of greater than 30 dB. The methodology can be implemented in a single integrated circuit or as more than one integrated circuit. Those skilled in the art will understand and appreciate these and other performance benefits can be facilitated by implementing the amplifier as a single IC, including the dual gate device, the feedback network and gate bias networks all on the same IC chip.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A low noise amplifier comprising:
   a dual gate transistor device having a first gate operative to receive a radio frequency (RF) input signal at an input of the amplifier and a drain coupled to provide an amplified output signal to an output of the amplifier;
   a feedback network coupled between the input and output of the amplifier, the feedback network including a resistive component electrically connected in series with a DC blocking component, such that the DC blocking component is connected toward an output side of the amplifier and the resistive component is connected toward an input side of the amplifier; and
   a first bias network coupled to provide a DC bias to a node between the resistive component and the DC blocking component of the feedback network for biasing the first gate of the dual gate transistor device.

2. The amplifier of claim 1, the dual gate transistor device further comprising a high electron mobility transistor (HEMT) device.

3. The amplifier of claim 2, the first bias network further comprising at least one of a gate bias resistor and a RF choke network.

4. The amplifier of claim 2, further comprising a second bias network coupled to provide a DC bias voltage to a second gate of the HEMT device, the first bias network providing a DC bias voltage that is less than the DC bias voltage provided by the second bias network.

5. The amplifier of claim 4, the first bias network providing a negative voltage at the node of the feedback network between about 0V and about –5V and the second bias network providing a positive voltage between about 0V and about 5V.

6. A single integrated circuit comprising the amplifier of claim 4.

7. The amplifier of claim 1, the resistive component of the feedback network having a resistance in a range from about 500 Ω to about 1300 Ω and the amplifier having a gain that varies as a function of the resistance of the resistive component of the feedback network, such that the amplifier has a noise figure that is less than about 1 dB.

8. A low noise amplifier having an input and an output, comprising:
   a dual gate field effect transistor having a first gate operative to receive a RF signal from the input and a drain coupled to provide an amplified output signal to the output;
   a feedback network including at least one resistor in series with a DC blocking component coupled between the drain and the first gate, such that the DC blocking component is coupled to the drain and the at least one resistor is coupled to the first gate;
   a first bias network coupled to provide a first bias to a node of the feedback network for biasing the first gate, the first bias network being decoupled from a source of the dual gate field effect transistor; and
   a second bias network coupled to provide a second bias to a second gate of the dual gate field effect transistor.

9. The amplifier of claim 8, the dual gate field effect transistor device further comprising a high electron mobility transistor (HEMT) device.

10. The amplifier of claim 8, the first bias network coupled to a node of the feedback network between the resistive component and the DC blocking component.

11. The amplifier of claim 8, the first bias network coupled to a node of the feedback network at the juncture of the resistive part of the feedback network and the first gate of the transistor device.

12. The amplifier of claim 8, the first bias network further comprising at least one of a gate bias resistor and a RF choke network.

13. The amplifier of claim 8, the first bias network providing a low negative DC voltage in a range from about 0V to about –5V at the node of the feedback network and the second bias network providing a low positive DC voltage in a range from about 0V to about 5V.

14. An integrated circuit comprising the amplifier of claim 8.

15. The amplifier of claim 8, the amplifier having a gain that varies as a function of a resistance of the resistor of the feedback network, the resistance being selected to provide gain that enables the amplifier to have a noise figure that is less than about 1 dB.

16. The amplifier of claim 15 implemented as a single stage amplifier, the at least one resistor in the feedback network having a resistance selected to provide the single stage amplifier with a gain in a range from about 20 dB to about 30 dB.

17. A method for implementing a low noise amplifier, comprising:
   providing a dual gate transistor device connected between an input and an output of the amplifier;
   providing a feedback path between the output and a first gate of the transistor device electrically connected with the input of the amplifier, the feedback path having a resistive part configured to provide the amplifier with a desired gain over a given frequency range and a DC blocking component in series with the resistive part of the feedback path;
   biasing the first gate of the transistor device with a first DC voltage through a node associated with the resistive part of the feedback path; and
   biasing a second gate of the transistor device with a second DC voltage that is greater than the first voltage, whereby a noise figure less than about 1 dB can be achieved.

18. The method of claim 17 in which the amplifier is implemented as an integrated circuit.

19. The method of claim 17, in which the amplifier is a single stage amplifier having a resistance selected to provide the single stage amplifier with a gain that exceeds 15 dB.

20. The method of claim 17, the biasing of the first gate further comprising biasing the first gate with a low negative voltage of less than about –2V and the biasing of the second gate further comprising biasing the second gate with a low positive voltage of less than about 3V.

* * * * *